(12) United States Patent
Walser et al.

(10) Patent No.: US 11,913,976 B2
(45) Date of Patent: Feb. 27, 2024

(54) FIELD DEVICE HAVING A SAFE INTERFACE

(71) Applicant: Endress+Hauser Wetzer GmbH+Co. KG, Nesselwang (DE)

(72) Inventors: Björn Walser, Oberstaufen (DE); Roberto Lugli, Segrate (IT); Michael Schnalke, Nesselwang (DE); Fabian Schmölz, Rieden am Forggensee (DE)

(73) Assignee: Endress+Hauser Wetzer GmbH+Co. KG, Nesselwang (DE)

( * ) Notice: Subject to any disclaimer, the term of this patent is extended or adjusted under 35 U.S.C. 154(b) by 154 days.

(21) Appl. No.: 17/753,836

(22) PCT Filed: Aug. 20, 2020

(86) PCT No.: PCT/EP2020/073408
§ 371 (c)(1),
(2) Date: Mar. 16, 2022

(87) PCT Pub. No.: WO2021/052710
PCT Pub. Date: Mar. 25, 2021

(65) Prior Publication Data
US 2022/0334149 A1 Oct. 20, 2022

(30) Foreign Application Priority Data

Sep. 18, 2019 (DE) .................. 10 2019 125 150.8

(51) Int. Cl.
*G01R 19/00* (2006.01)

(52) U.S. Cl.
CPC ............................ *G01R 19/0092* (2013.01)

(58) Field of Classification Search
CPC ............ G01R 19/0092; G05B 19/0425; G05B 2219/25428
See application file for complete search history.

(56) References Cited

U.S. PATENT DOCUMENTS 7,844,410 B2 *  11/2010  Lalla ................ G01F 15/024
                                                          702/65
7,885,610 B2    2/2011   Isenmann et al.
(Continued)

FOREIGN PATENT DOCUMENTS

CN        108363368 A     8/2018
DE     102008036967 A1    2/2010
(Continued)

*Primary Examiner* — Jay Patidar
(74) *Attorney, Agent, or Firm* — Mark A. Logan; Endress+Hauser (USA) Holding, Inc.

(57) ABSTRACT

A field device having a safe interface is based on two voltage regulators designed to set electrical current between corresponding contacts of the interface. The field device tests via which of the contacts the field device is connected with a superordinate unit and an automatic configuration of the interface can be performed for the appropriate transmission standard. Because the contacting to the superordinated unit is checked repetitively by means of two electrical current regulators it is assured that the field device can determine and automatically react to a change of the contacting at the interface even during measurement operation. This makes the interface safe and thereby increases the safety of the process plant, in which the field device is applied.

10 Claims, 3 Drawing Sheets

(56) References Cited

U.S. PATENT DOCUMENTS

2016/0341767 A1 11/2016 Nyberg
2018/0212536 A1* 7/2018 Wiesner .............. H02M 7/5395

FOREIGN PATENT DOCUMENTS

| DE | 102010041731 A1 * | 4/2012 | ......... G05B 19/0425 |
| DE | 102013114377 A1 | 6/2015 | |
| DE | 102017201166 A1 | 7/2018 | |

* cited by examiner

FIELD DEVICE HAVING A SAFE INTERFACE

CROSS-REFERENCE TO RELATED APPLICATIONS

The present application is related to and claims the priority benefit of German Patent Application No. 10 2019 125 150.8, filed on Sep. 18, 2019, and International Patent Application No. PCT/EP2020/073408, filed on Aug. 20, 2020, the entire contents of which are incorporated herein by reference.

TECHNICAL FIELD

The invention relates to a field device having a safe interface and to a corresponding method for operating such field device.

BACKGROUND

In automation technology, especially in process automation technology, field devices are often applied, which serve for registering and/or influencing various measured variables. The measured variable to be determined can be, for example, a fill level, a flow, a pressure, the temperature, the pH value, the redox potential, a conductivity or the dielectric value of a medium. For registering the corresponding measured values, the field devices have suitable sensors applying appropriate measuring principles. A large number of such field devices are produced and sold by the firm, Endress+Hauser.

For transmitting the measured values of the field device to a superordinated unit, for example, to a process control station, still widely used in automation technology for historical reasons are signals based on the 4-20 mA standard. Using such analog signals, a safe and simple data transfer of a measured value can be assured. According to the 4-mA standard (as defined in DIN IEC 60381-1), the direct current of the two lines of a loop is so set that it represents the current value of the process variable. In contrast, in the case of a voltage based standardized signal, a corresponding voltage value is measured between two lines. If the field device is a two-conductor field device, then energy supply of the field device and transmission of the measurement signal occur via the same two conductors. In the case of a four-conductor interface, the energy supplying occurs separately via the two additional conductors. A field device having a 4-20 mA interface is shown, for example, in DE 10 2013 114 377 A1.

In modern process plants, the transmission of measured values, and the communication with the field devices generally, occurs increasingly also based on digital transmission standards, such as, for example, "10-Link" according to the IEC standard 61131-9, "PROFIBUS", "HART", "wireless HART" or "Ethernet". Accordingly, modern field devices must have an interface, via which both the measured value can be transmitted according to an analog standard, such as 4-20 mA, and also digital communication can be performed by means of corresponding other standards.

Field devices with corresponding interfaces are commercially available. In such case, the field device must be equipped before startup to transmit the measured value according to a desired standard. In this connection, in the case of multipole interfaces, such as M12 plug connections, it must, moreover, be established earlier, via which contacts of the interface the measured value is to be transmitted. Accordingly, in the case of a rewiring of the field device, for example, in the context of a new site of use, the field device must, in given cases, also be set for a new transmission standard. If this is not done, then, especially in the case of analog transmission standards, there is the danger that the superordinated unit will make an incorrect interpretation of the measured value carried by the transmitted signal. Depending on type of process, such can bring about a dangerous situation in the process installation, such as, for example, an overheating, an overfilling or a hyperacidification of a medium.

SUMMARY

Accordingly, an object of the invention is to provide a field device having a safe interface.

The invention achieves this object by a field device for measuring a measured variable, comprising:
  a sensor, which is designed to measure the corresponding measured value,
  an interface having at least four electrical contacts, such as, for example, an M12 plug contact,
  a first electrical current regulator, which is designed
    to set a first electrical current between the first contact and the second contact when the field device is contacted via the interface such that a first voltage source is connected across such contacts,
  a second electrical current regulator, which is designed,
    to set a second electrical current between the first contact and the third contact when the field device is contacted via the interface such that a second electrical voltage source is connected across such contacts,
    otherwise to generate a second signal, and
  a control unit, which is designed,
    to transmit the measured value according to a predefined digital standard, especially the IO-Link standard, via the fourth contact when the second electrical current is settable between the first contact and the third contact, and
    to control the first electrical current regulator in such a manner that the electrical current level of the first electrical current corresponds to the measured value according to a predefined electrical current signal standard (especially the 4-20 mA standard) when the second electrical current regulator generates the second signal.

In such case, the terminology, "unit", in the context of the invention means, in principle, any electronic circuit, which is suitably designed for the contemplated application. It can, thus, depending on requirement, be an analog circuit for producing, or processing, corresponding analog signals. It can even be a digital circuit such as an FPGA or a storage medium in cooperation with a program. In such case, the program is designed to perform the corresponding method steps, or to apply the needed computer operations of a unit. In this context, different electronic units of the fill level measuring device can, within the scope of the invention, potentially also use a shared physical memory, be operated by means of the same physical, digital circuit.

According to the invention, implementing two electrical current regulators enables checking in redundant manner, via which of the contacts the field device is contacted with the superordinated unit, such that the field device itself can set the transmission standard suitable for such. For this, the first electrical current regulator is advantageously designed to generate a first signal when the field device is contacted in such a manner that no electrical voltage source is connected across the first contact and the second contact. Based on such, the first electrical current regulator can report to the control unit that the measured value can at least not be transmitted via analog standard. When the first electrical current regulator includes a controllable operational amplifier for controlling the electrical current level of the first electrical current, it can be very easily detected, in case the first electrical current is not settable, namely in that the control unit detects the control signal of the operational amplifier as first signal and the operational amplifier is working in saturation.

The field device of the invention can, additionally, be so designed that, depending on contacting of the interface, the first voltage source or the second voltage source supplies the first electrical current regulator, the second electrical current regulator and/or the control unit with power. In this way, a separate power supply of the field device, such as, for example, a battery, does not need to be provided.

Corresponding to the field device of the invention according to one of the above described embodiments, the object of the invention is additionally achieved by a corresponding method for its operation. In such case, the method includes for transmitting the measured value from the field device method steps as follows:

measuring the measured value,
setting the second electrical current between the first contact and the third contact when the field device is contacted via the interface such that a second electrical voltage source is connected across such contacts, and otherwise
generating the second signal,
transmitting the measured value according to the predefined digital protocol via the fourth contact when the second signal is not generated,
setting the first electrical current between the first contact and the second contact when the field device is contacted via the interface such that a first electrical voltage source is connected across such contacts, and otherwise
generating the first signal,
wherein method steps are cyclically repeated at least when the first signal is not generated. Otherwise, only measuring the measured value, transmitting the measured value according to the predefined digital protocol via the fourth contact, setting the first electrical current and the possible generating of the first signal are repeated.

Because of the method as well as its cyclic repetition, it is assured that the field device can detect and automatically react to a change of the contacting even during measurement operation, without requiring that the configuration of the field device has to be manually changed. In this way, the safety of the process plant is increased, since a possible incorrect interpretation of the transmitted signals by the superordinated unit is avoided.

When the second signal is generated, the method can be extended by the following method step:

controlling the first electrical current regulator, such that the electrical current level of the first electrical current ($a_1$) corresponds to the measured value according to the predefined electrical current signal standard, In such case, in turn, all method steps are cyclically repeated when, after operating the first electrical current regulator, the first signal is generated. In the other case, only repeated are measuring the measured value and controlling the first electrical current regulator, such that the electrical current level of the first electrical current corresponds to the measured value according to the predefined electrical current signal standard. In this way, the field device can independently detect, whether the wiring to the superordinated unit was changed and, thus, a reconfiguration of the interface is required.

In order that a necessary reconfiguration of the interface is rapidly determinable in the case of doubt, it is advantageous in the context of the invention that the first electrical current is set between the first contact and the second contact a maximum of 300 ms after the second electrical current regulator sets the second electrical current between the first contact and the third contact. In this way, the rate, with which the method is cyclically repeated, can be correspondingly increased.

BRIEF DESCRIPTION OF THE DRAWINGS

The invention will now be explained in greater detail based on the appended drawing, the figures of which show as follows.

DETAILED DESCRIPTION

Figure 1:
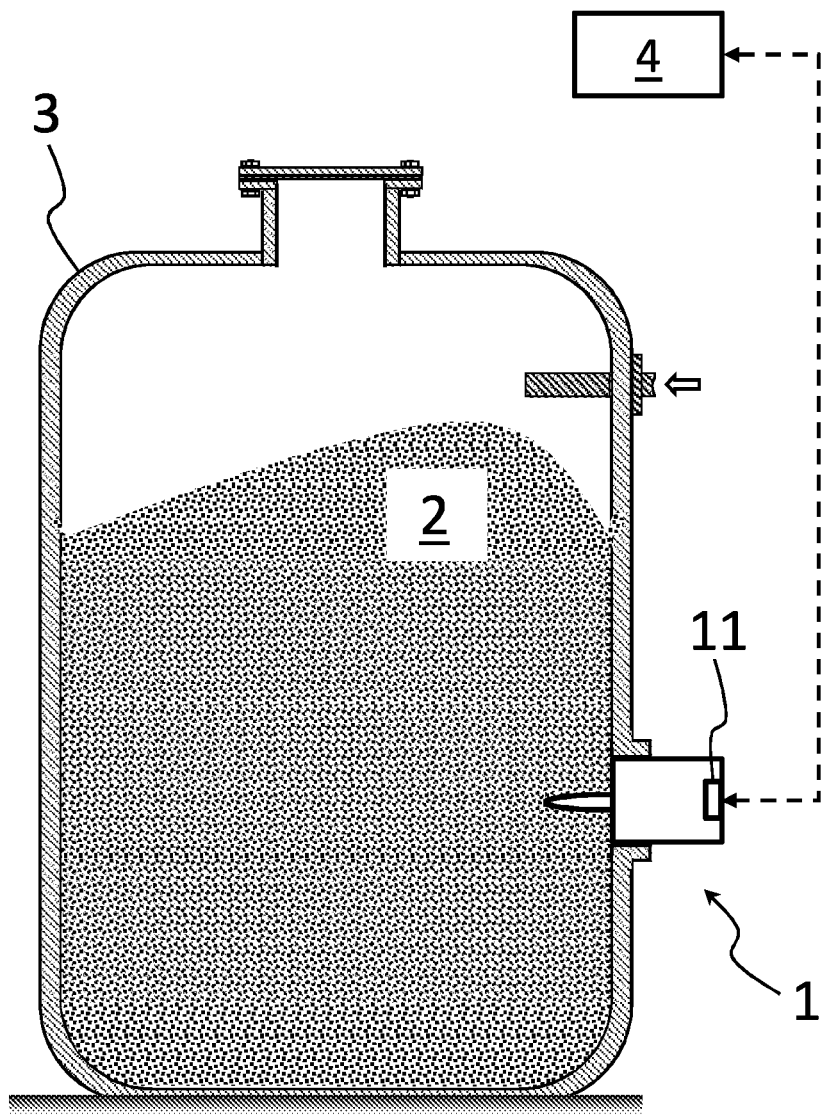
FIG. 1 shows a field device of the invention shown on a container and connected via an interface to a superordinated unit.

For providing a general understanding of the invention, FIG. 1 shows schematically a container 3, in which a medium 2, such as, for example, chemicals, grain, cement, water, liquefied gas or a bulk good is located. In order to determine a measured variable relevant for the process installation, thus a measured variable such as the temperature, the pressure or a fill level, there is mounted laterally on the container 3 a field device 1 of the invention. For transmitting the corresponding measured value to, or for the exchange of other measuring device-specific data with, a superordinated unit 4, the field device 1 includes a suitable interface 11. The superordinated unit 4 can be, for example, a process control station for monitoring the process plant.

Figure 2:
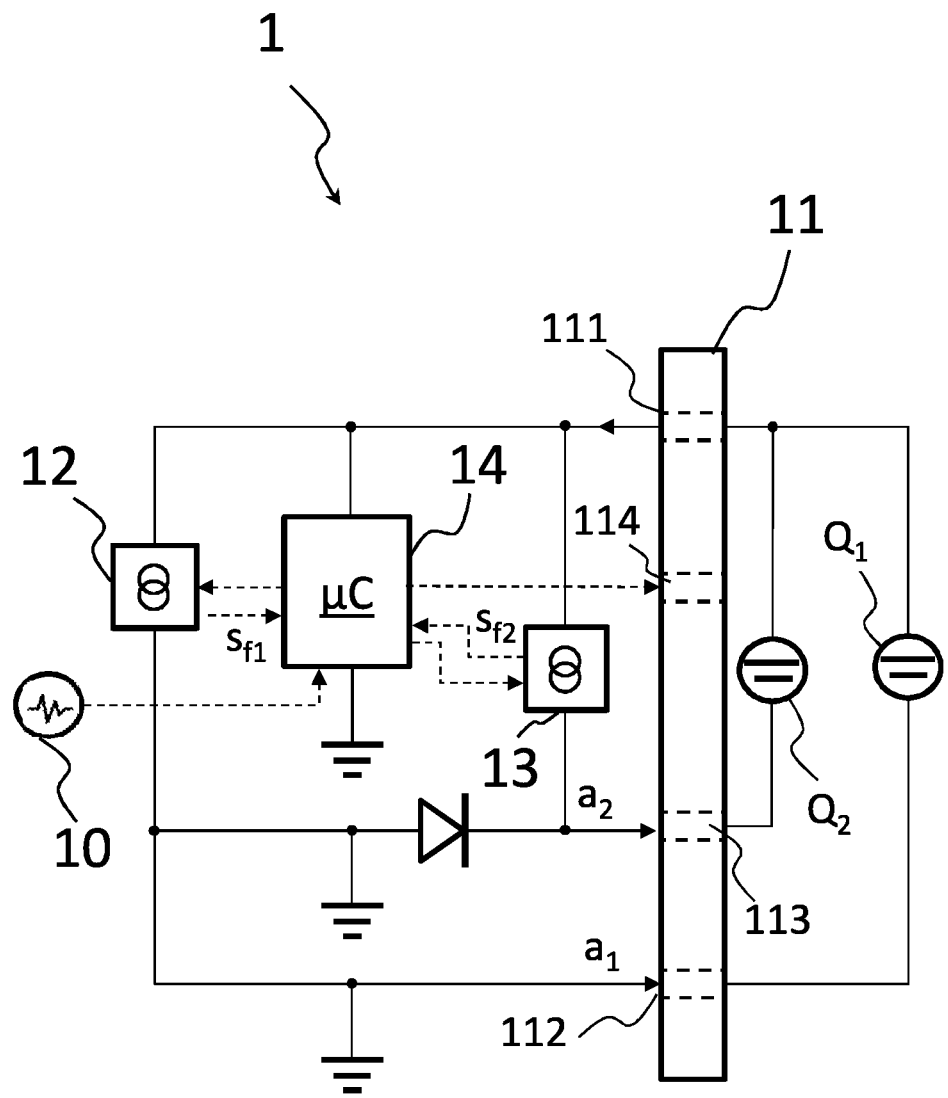
FIG. 2 shows an equivalent circuit diagram of the field device.

An established analog standard for transmitting the measured value in the field of process automation is the 4-20 mA standard. In such case, the value of a first direct current $a_1$ changes linearly with the measured value. This means that an electrical current level of 4 mA corresponds to 0% of the measured value, while 20 mA is equivalent to 100% of the measured value. In the case of a fill level measurement, for example, 4 mA corresponds, thus, to a completely empty container 3. 12 mA corresponds to a 50% filled container 3. And a completely filled container 3 is represented by a 20 mA electrical current level of the signal. Accordingly, the interface 11 of the field device 1 requires for implementing the 4-20 mA standard at least two electrical contacts 111, 112, such as shown in FIG. 2. The first electrical current $a_1$ of the 4-20 mA signal is set, in such case, by a first electrical current regulator 12 of the field device 1. For control of the first electrical current $a_1$ in the simplest case, the first electrical current regulator 12 can operate based on an operational amplifier, which is connected, for example, as a voltage current converter. The first electrical current regulator 12 is, in turn, controlled by a control unit 14, such as, for example, a microcontroller, by means of a corresponding control signal. In such case, the control unit 14 obtains the measured value from a sensor 10, which is designed appropriately for measuring a measured variable.

In the case of the embodiment of the field device 1 shown in FIG. 2, both the control unit 14 as well as also the first electrical current regulator 12 are supplied with the required power via the interface 11 from the superordinated unit 4. In the circuit diagram of FIG. 2 this power supply is provided via the first contact 111 and the second contact 112 of the interface 11 by a first voltage source $Q_1$. Analogously thereto, also the sensor 10 can, depending on functional principle, be supplied with power from the same source (not explicitly shown in FIG. 2).

Advantageous in the 4-20 mA standard is that an interrupted line between field device 1 and superordinated unit 4 is easily recognizable as a disturbance, since the first electrical current $a_1$ is, in such case, completely interrupted. Disadvantageous in such standard, however, is the relatively high electrical current consumption and the only conditionally present opportunity to transmit, supplementally to the measured value, additional data or parameters. Therefore, the measured value transmission in modern process plants occurs increasingly purely on a digital basis.

In order to be able to be applied variably in different fields of use, the interface 11 of the field device 1 is designed flexibly, so that the measured value can be transmitted according to the 4-20 mA, analog standard, or along with other data, also using digitally based transmission standards. Digital standards for this include, for example, "10-Link" according to the IEC standard 61131-9, "PROFIBUS", "HART", "wireless HART" and "Ethernet". Accordingly, the interface 11 of the field device 1 includes, such as shown in FIG. 2, besides the two contacts 111, 112 for the 4-20 mA-based measured value transmission, two other contacts 113, 114. Since the IO-Link standard requires three contacts 111, 113, 114, it is, in such case, correspondingly an option that the control unit 14 transmits the measured value or other parameters by means of this standard via the fourth contact 114, wherein, in such case, the third contact 113 of the interface 11 serves as ground potential. In contrast with the illustration, the control unit 14 can use for generating the corresponding signal a separate IO-Link module, which is activated only in the case of configuration of the interface 11 for IO-Link based transmission. In the case of this configuration of the interface 11, the control unit 14 can be supplied with power from the superordinated unit 4 via the first contact 111. In the equivalent circuit diagram shown in FIG. 2, such is provided, in turn, by a second voltage source $Q_2$ connected between the first contact 111 and the third contact 113. The interface 11 can be designed, for example, in the form of an M12-plug connection or a comparable plug connection-type having at least four contacts.

In the case of start-up on the container 3, the field device 1 must be configured for the at least two potentially possible standards the interface 11 is to use. Moreover, the corresponding contacts 111-114 of the interface 11 must be correctly contacted. If such does not happen, then such can in the worst case lead to the fact that the incorrect wiring, or the incorrect configuration, is not detected by the superordinated unit 4 and the transmitted signals are interpreted rather as a measured value not correctly reflecting the actual measured value.

According to the invention, the field device 1 includes, consequently, additionally, a second electrical current regulator 13, which is arranged between the first contact 111 and the third contact 113 of the interface 11. In this way, it is possible to set a second electrical current $a_2$ between the first contact 111 and the third contact 113 when the field device 1 is contacted via the interface 11 such that the superordinated unit 4, and the second electrical voltage source $Q_2$, is connected across such contacts 111, 113. In such case, the second electrical current $a_2$ reaches as electrical current level a lower value, for example, 200 µA. When it is possible to set the second electrical current $a_2$ by means of the second electrical current regulator 13, then the field device 1 is, as a result, then so configured that it transmits the measured value, or other parameters, via the fourth contact 114 by means of the predefined digital protocol, such as the IO-Link.

In the case, in which the second electrical current $a_2$ between the first contact 111 and the third contact 113 can be set by means of the second electrical current regulator 13, nevertheless also the first electrical current regulator 12 is activated, in order, for the sake of safety, to check, whether the superordinated unit 4, thus the first electrical voltage source $Q_1$, is connected across the first contact 111 for the power supply and the second contact 112 for the grounding of the first electrical current signal $a_1$. The operation of the first electrical current regulator 12 can occur, in such case, very near in time, for example, 300 ms, after the second electrical current regulator 13 sets the second electrical current $a_2$ between the first contact 111 and the third contact 113. For just checking whether a first electrical current $a_1$ can be set between the first contact 111 and the second contact 112, its electrical current level does not have to correspond to the measured value according to the 4-20 mA standard. Instead, a significantly lower electrical current level, for example, again, 200 µA can be used.

If the testing shows that the first electrical current $a_1$ is not settable by means of the first electrical current regulator 12, then this is interpreted as confirmation that the three contacts 111, 113, 114 are still connected with the superordinated unit 4 for digital data transmission. Accordingly, the digital data transmission via the fourth contact 114 remains active. The first electrical current regulator 12 signals the control unit 14 by means of a corresponding first signal $s_{f1}$ that the first electrical current $a_1$ is not settable. When the first electrical current regulator 12 is based on an operational amplifier, the control unit 14 can, for example, detect the control signal of the operational amplifier as first signal $s_{f1}$, in case the operational amplifier is operating in saturation, thus, when it is attempted to set the first electrical current $a_1$ to no avail.

Figure 3:
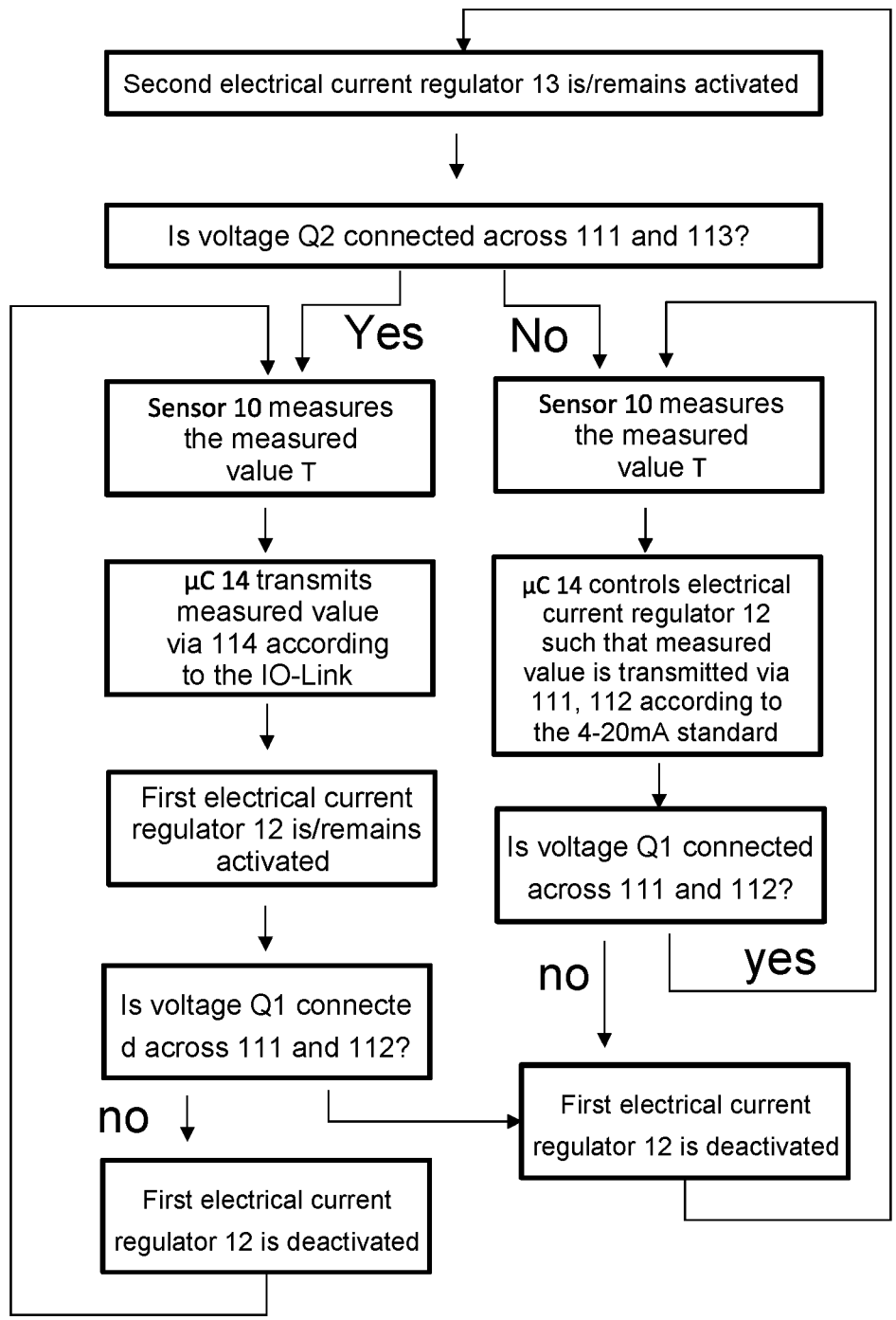
FIG. 3 shows a flowchart of the method of the present disclosure for operation of the field device.

When the testing by means of the first electrical current regulator 12 shows that the first electrical current $a_1$ cannot be set and, thus, the measured value cannot be transmitted as analog data via the contacts 111, 112, the first electrical current regulator 12 can, in such case, be deactivated. FIG. 3 shows these method steps schematically.

While these above mentioned method steps are cyclically repeated, as long as the second voltage source $Q_2$ is connected across the first contact 111 and the third contact 113, or as long as the first electrical current $a_1$ is not settable, the control unit 14 of the field device 1 can detect a change in the situation as soon as it happens.

If the control unit 14 detects due to a missing first signal $s_{f1}$ of the first electrical current regulator 12 that now the first electrical current $a_1$ between the first contact 111 and the second contact 112 can be set, then the control unit 14 deduces therefrom that the field device 1 is henceforth so to be configured that the measured value is now to be transmitted via these contacts 111, 112 by analog measured value transmission. For checking this, the second electrical current regulator 13 is (or remains) activated, in order to verify that indeed no second electrical current $a_2$ can now be set between the first contact 111 and the third contact 113. In the case of corresponding verification, thus when the second electrical current regulator 13 transmits a corresponding signal $s_{f2}$ to the control unit 14, the control unit 14 controls the first electrical current regulator 12 such that the first electrical current $a_1$ corresponds to the measured value measured by the sensor according to the 4-20 mA standard.

The method of the invention is shown in summary in FIG. 3. Advantageous here is that the two electrical current regulators 12, 13 virtually redundantly check via which of the contacts 111-114 the field device 1 is contacted with the superordinated unit 4, such that the corresponding transmission standard can be set. By the cyclic repetition of the method steps, it is assured that the field device 1 determines a change of the contacting even during measurement operation and can automatically react, without requiring that the configuration of the field device 1 must be manually changed. This supplementally increases the safety of the total process plant.

The invention claimed is:

1. A field device for measuring a process variable, comprising:
 a sensor designed to measure the process variable;
 an interface having at least four electrical contacts;
 a first electrical current regulator designed to set a first electrical current between a first contact of the at least four electrical contacts and a second contact of the at least four electrical contacts when the field device is contacted via the interface such that a first voltage source is connected across the first and the second contacts;
 a second electrical current regulator designed to set a second electrical current between the first contact and a third contact of the at least four electrical contacts when the field device is contacted via the interface such that a second electrical voltage source is connected across the first and the third contacts and to generate a second signal; and
 a control unit designed to:
  transmit the measured process variable according to a predefined digital standard via a fourth contact of the at least four electrical contacts when the second electrical current is settable between the first contact and the third contact, and
  control the first electrical current regulator such that the electrical current level of the first electrical current corresponds to the measured process variable according to a predefined electrical current signal standard when the second electrical current regulator generates the second signal.

2. The field device as claimed in claim 1, wherein the first electrical current regulator is designed to generate a first signal when the field device is contacted in such a manner that no electrical voltage source is connected across the first contact and the second contact.

3. The field device as claimed in claim 2, wherein, depending on contacting of the interface, the first voltage source or the second voltage source supplies the first electrical current regulator, the second electrical current regulator, and/or the control unit with power.

4. The field device as claimed in claim 3, wherein the first electrical current regulator comprises a controllable operational amplifier for controlling the electrical current level of the first electrical current, and wherein the control unit is designed to detect a control signal of the operational amplifier as the first signal when the operational amplifier is working in saturation.

5. The field device as claimed in claim 1, wherein an IO-Link standard is implemented in the control unit as a digital standard for transmitting the measured process variable via the fourth contact.

6. The field device as claimed in claim 1, wherein a 4-20 mA standard is implemented in the control unit as a standard for electrical current signal-based transmitting of the measured process variable via the first contact and the second contact.

7. The field device as claimed in claim 1, wherein the interface is designed as an M12 plug-in connection.

8. A method for transmitting a measured process variable of a field device, comprising:
 providing the field device, including:
  a sensor designed to measure the process variable;
  an interface having at least four electrical contacts;
  a first electrical current regulator designed to set a first electrical current between a first contact of the at least four electrical contacts and a second contact of the at least four electrical contacts when the field device is contacted via the interface such that a first voltage source is connected across the first and the second contacts;
  a second electrical current regulator designed to set a second electrical current between the first contact and a third contact of the at least four electrical contacts when the field device is contacted via the interface such that a second electrical voltage source is connected across the first and the third contacts and to generate a second signal; and
  a control unit designed to:
   transmit the measured process variable according to a predefined digital standard via a fourth contact of the at least four electrical contacts when the second electrical current is settable between the first contact and the third contact, and
   control the first electrical current regulator such that the electrical current level of the first electrical current corresponds to the measured process variable according to a predefined electrical current signal standard when the second electrical current regulator generates the second signal;
 measuring the process variable,
 setting the second electrical current between the first contact and the third contact when the field device is contacted via the interface such that the second electrical voltage source is connected across such contacts, and otherwise generating the second signal;
 transmitting the measured process variable according to the predefined digital protocol via the fourth contact when the second signal is not generated;
 setting the first electrical current between the first contact and the second contact when the field device is contacted via the interface such that the first electrical voltage source is connected across such contacts, and otherwise generating the first signal;
 wherein method steps are cyclically repeated when the first signal is not generated, and
 wherein, when the first signal is generated, measuring the process variable, transmitting the measured process variable according to the predefined digital protocol via the fourth contact, setting the first electrical current, and generating of the first signal are repeated.

9. The method as claimed in claim 8, further comprising:
 controlling the first electrical current regulator such that the electrical current level of the first electrical current corresponds to the measured process variable according to the predefined electrical current signal standard when the second signal is generated, wherein method steps are cyclically repeated when the first signal is generated, and wherein, when the first signal is not generated, measuring the measured process variable and controlling the first electrical current regulator are repeated, such that the electrical current level of the first electrical current corresponds to the measured process variable according to the predefined electrical current signal standard.

10. The method as claimed in claim 9, wherein the first electrical current between the first contact and the second contact is set a maximum of 300 milliseconds after the second electrical current regulator sets the second electrical current between the first contact and the third contact.

* * * * *